(12) United States Patent
Chuang et al.

(10) Patent No.: US 12,538,557 B2
(45) Date of Patent: *Jan. 27, 2026

(54) SEMICONDUCTOR DEVICE AND METHOD FOR MAKING THE SAME

(71) Applicant: TAIWAN SEMICONDUCTOR MANUFACTURING CO., LTD., Hsinchu (TW)

(72) Inventors: Chi-Yi Chuang, Hsinchu (TW); Ching-Wei Tsai, Hsinchu (TW); Kuan-Lun Cheng, Hsinchu (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/653,928

(22) Filed: May 2, 2024

(65) Prior Publication Data
US 2024/0282840 A1    Aug. 22, 2024

Related U.S. Application Data

(63) Continuation of application No. 17/806,100, filed on Jun. 9, 2022, now Pat. No. 11,978,782, which is a
(Continued)

(51) Int. Cl.
| | |
|---|---|
| H10D 64/68 | (2025.01) |
| H10D 30/01 | (2025.01) |
| H10D 30/62 | (2025.01) |
| H10D 30/69 | (2025.01) |
| H10D 84/85 | (2025.01) |

(52) U.S. Cl.
CPC ......... *H10D 64/689* (2025.01); *H10D 30/024* (2025.01); *H10D 30/0415* (2025.01); *H10D 30/62* (2025.01); *H10D 30/701* (2025.01); *H10D 84/853* (2025.01)

(58) Field of Classification Search
CPC .............. H10D 64/689; H10D 30/024; H10D 30/0415; H10D 30/62; H10D 30/701; H10D 84/853; H10D 84/85; H10D 84/83; H10D 84/0181; H10D 84/0144; H10D 84/856

See application file for complete search history.

(56) References Cited

U.S. PATENT DOCUMENTS

| | | |
|---|---|---|
| 9,559,168 B2 | 1/2017 | Lai et al. |
| 9,768,030 B2 | 9/2017 | Lee |

(Continued)

*Primary Examiner* — Latanya N Crawford Eason
(74) *Attorney, Agent, or Firm* — Finnegan, Henderson, Farabow, Garrett & Dunner, L.L.P.

(57) ABSTRACT

The present disclosure relates to a hybrid integrated circuit. In one implementation, an integrated circuit may have a first region with a first gate structure having a ferroelectric gate dielectric, at least one source associated with the first gate of the first region, and at least one drain associated with the first gate structure of the first region. Moreover, the integrated circuit may have a second region with a second gate structure having a high-κ gate dielectric, at least one source associated with the second gate structure of the second region, and at least one drain associated with the second gate structure of the second region. The integrated circuit may further have at least one trench isolation between the first region and the second region.

20 Claims, 7 Drawing Sheets

Related U.S. Application Data continuation of application No. 16/415,136, filed on May 17, 2019, now Pat. No. 11,362,191.

(56) References Cited

U.S. PATENT DOCUMENTS

| | | |
|---|---|---|
| 9,852,785 B2 | 12/2017 | Chih et al. |
| 9,978,868 B2 | 5/2018 | Lai et al. |
| 10,249,756 B2 | 4/2019 | Tu et al. |
| 2016/0035856 A1 | 2/2016 | van Bentum et al. |
| 2018/0082729 A1 | 3/2018 | Slesazeck et al. |
| 2018/0366476 A1 | 12/2018 | Liu |
| 2019/0207009 A1 | 7/2019 | Yamaguchi |
| 2019/0333920 A1 | 10/2019 | Chen et al. |
| 2020/0058658 A1 | 2/2020 | Heo et al. |
| 2020/0194591 A1 | 6/2020 | Kim et al. |

SEMICONDUCTOR DEVICE AND METHOD FOR MAKING THE SAME

CROSS-REFERENCE TO RELATED PATENT APPLICATIONS

This application is a continuation application of U.S. Non-provisional patent application Ser. No. 17/806,100, titled "SEMICONDUCTOR DEVICE AND METHOD FOR MAKING THE SAME" and filed on Jun. 9, 2022, which is a continuation application of U.S. Non-provisional patent application Ser. No. 16/415,136, titled "SEMICONDUCTOR DEVICE AND METHOD FOR MAKING THE SAME" and filed on May 17, 2019, both of which are incorporated herein by reference in their entireties.

BACKGROUND

Transistor technologies, such as complementary metal-oxide-semiconductor (CMOS) architectures, fin field-effect transistor (FinFET) architectures, or the like, generally use voltage applied to a gate terminal to control current flow between a source region and a drain region. Transistors may function as switches based gate voltage.

Gates using ferroelectric materials may provide increased power efficiency due to a reduced subthreshold swing. However, ferroelectric materials may undergo hysteresis at high frequencies, and may affect their effectiveness or performance, such as performance in alternating current (AC) applications.

BRIEF DESCRIPTION OF THE DRAWINGS

Aspects of the present disclosure can be understood from the following detailed description and the accompanying figures. It is noted that, in accordance with the standard practice in the industry, various features are not drawn to scale. In fact, the dimensions of the various features may be arbitrarily increased or reduced for illustration or clarity of discussion.

DETAILED DESCRIPTION

Figure 1:
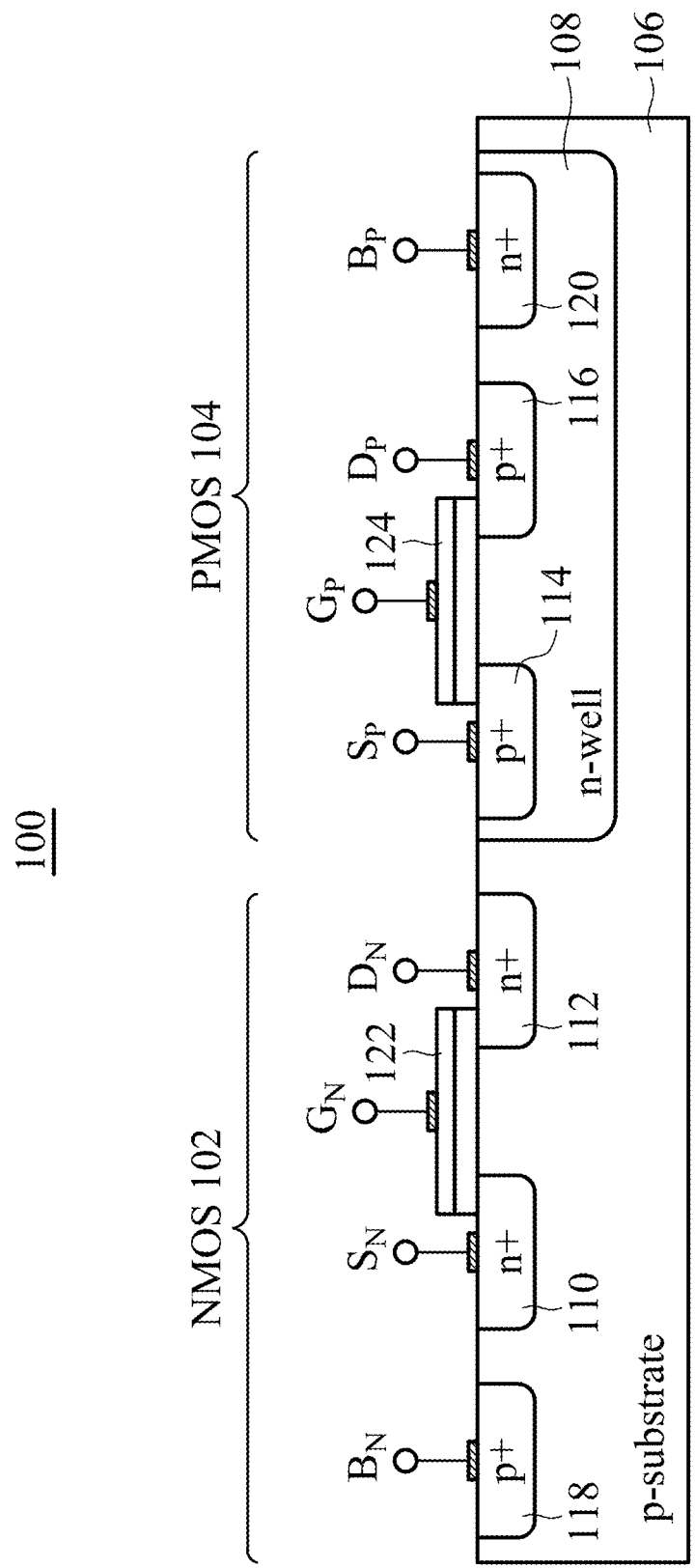
FIG. 1 depicts a complementary metal-oxide-semiconductor (CMOS) structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on," "over," and the like, may be used herein for ease of description to describe one element or feature's relationship to another element(s) or feature(s), including those illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As depicted in FIG. 1, a complementary metal-oxide-semiconductor (CMOS) structure 100 may include one or more N-type metal-oxide-semiconductors (NMOS) 102 and one or more P-type metal-oxide-semiconductors (PMOS) 104. For example, a p-type substrate 106 may include one or more n-type wells (e.g., well 108). In other embodiments, CMOS structure 100 may comprise an n-type substrate including one or more p-type wells.

As further depicted in FIG. 1, NMOS 102 may include a corresponding source well 110 and drain well 112. Similarly, PMOS 104 may include a corresponding source well 114 and drain well 116. NMOS 102 may include a corresponding body terminal 118, and PMOS 104 may include a corresponding body terminal 120. In some embodiments, body terminal 118 may be coupled with source well 110 (e.g., by connecting point $B_N$ to point $S_N$ via wiring) and/or to drain well 112 (e.g. by connecting point $B_N$ to point $D_N$ via wiring) to eliminate body bias in NMOS 102. Additionally or alternatively, body terminal 120 may be coupled with source well 114 (e.g., by connecting point $B_P$ to point $S_P$ via wiring) and/or to drain well 116 (e.g. by connecting point $B_P$ to point $D_P$ via wiring) to eliminate body bias in PMOS 104.

Although body terminal 118 is depicted on the same substrate side as source well 110 and drain well 112, and body terminal 120 is depicted on the same substrate side as source well 114 and drain well 116, body terminal 118 and/or body terminal 120 may instead be formed on the opposite side of substrate 106. In such embodiments, body terminal 118 and/or body terminal 120 may be arranged closer to gate 122 and/or gate 124, respectively, than depicted in the embodiment of FIG. 1.

Gate 122 ($G_N$) and gate 124 ($G_P$) may comprise oxide gates of CMOS structure 100. Gates 122 and 124 may comprise a dielectric layer and a metal layer. Gates 122 and 124 may allow for use of the CMOS structure by applying a voltage to control or vary currents between source well 110 and drain well 112 and currents between source well 114 and drain well 116, respectively. The dielectric materials used in gates 122 and 124 may control one or more properties of the gates, as explained further below with respect to FIG. 2.

Figure 2:
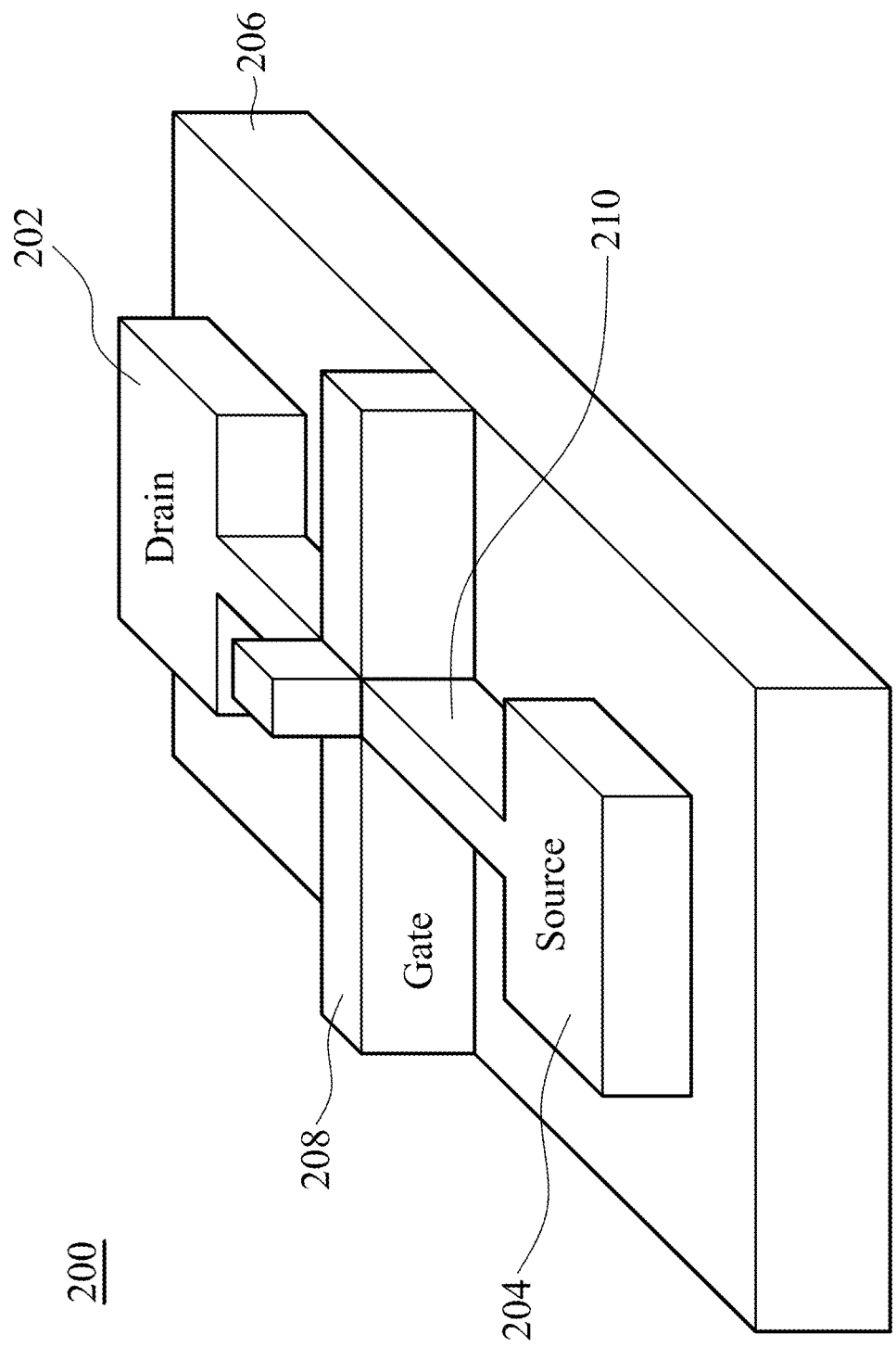
FIG. 2 depicts a fin field-effect transistor (FinFET), in accordance with some embodiments.

As depicted in FIG. 2, a fin field-effect transistor (FinFET) 200 may similarly include sources and drains, and may include these regions as raised regions 202, 204 over a substrate 206. The raised sources and drains may be coupled to gates (e.g., gate 208) via one or more fins (e.g., fin 210 connects source 204 to gate 208). A FinFET may comprise an NMOS, a PMOS, or a structure with a plurality of gates (e.g., an array of NMOS gates, an array of PMOS gates, or a CMOS structure).

Figure 3B:
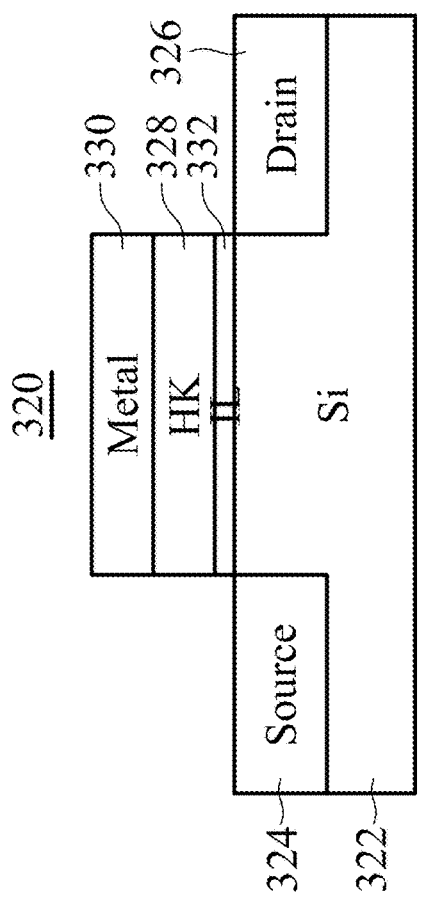
FIG. 3B depicts a high-κ (HK) gate, in accordance with some embodiments.
Figure 3A:
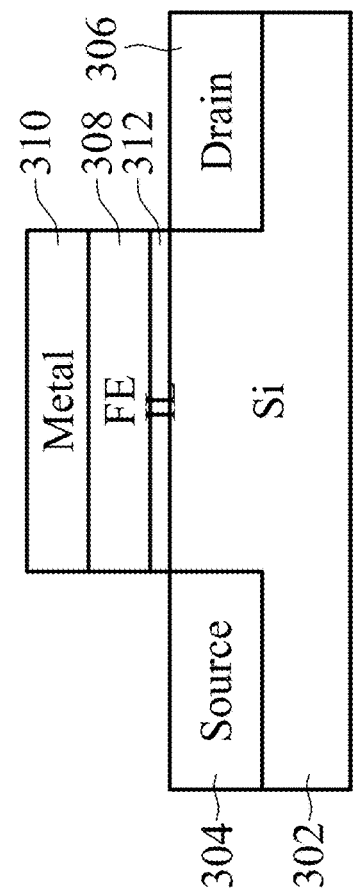
FIG. 3A depicts a ferroelectric (FE) gate, in accordance with some embodiments.

As depicted in FIG. 3A, a gate 300 (e.g., which may comprise gate 122 or gate 124 of FIG. 1 or gate 208 of FIG. 2) may comprise a ferroelectric (FE) gate. Accordingly, gate 208 may be formed on a substrate 302 and control a current between source 304 and drain 306. Gate 300 is an FE gate because oxide layer 308 comprises a ferroelectric material. For example, oxide layer 308 may comprise a perovskite, an HfO2-based material, an organic polymer, or the like. Oxide layer 308 may also comprise $Pb(Zr, Ti)O_3$, $SrBi_2Ta_2O_9$, $BaTiO_3$, $(Bi, La)_4Ti_3O_{12}$, HfZrO, HfGeO, HfLaO, HfSiO, HfGdO, HfYO, HfScO, HfNbO, HfAlO, PolyVinylidene Fluoride, TrFE (Trifluoroethylene), or the like. Metal layer 310 may comprise any layer suitable for an MOS gate. For example, metal layer 310 may comprise Ti, Ag, Al, TiAlN, TaC, TaCN, TaSiN, Mn, Zr, TiN, TSN, TaN, Ru, Mo, Al, WN, Cu, W, or the like.

In some embodiments, gate 300 may be formed using one or more lithography techniques. An interfacial layer 312 may form a surface for oxide layer 308. For example, interfacial layer 312 may comprise oxide, oxynitride ($Si\text{-}O_xN_y$), HfSiO, or the like. In some embodiments, interfacial layer 312 may promote adhesion of the deposited or formed layers (such as oxide layer 308) to substrate 302 or provide better interfacial properties to neighboring materials or layers. Other materials may be used based on the material(s) it interface with or properties to be provided.

As depicted in FIG. 3B, a gate 320 (e.g., which may comprise gate 122 or gate 124 of FIG. 1 or gate 208 of FIG. 2) may comprise a high-dielectric-constant (high-κ; HK) gate. Gate 320 may be formed on a substrate 322 and control a current between source 324 and drain 326. Gate 320 is an HK gate because oxide layer 328 comprises a dielectric material with a high κ value. A high κ material may refer to any material with a high dielectric constant, such as one greater than that of silicon dioxide, which is about 3.9. For example, oxide layer 328 may comprise $HfO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba, Sr)TiO_3$ (BST), $Al_2O_3$, $Si_3N_4$, silicon oxynitrides ($SiO_xN_y$), or the like. Metal layer 330 may comprise any layer suitable for an MOS gate. For example, similar to metal layer 310 of FIG. 3A, metal layer 330 may comprise Ti, Ag, Al, TiAlN, TaC, TaCN, TaSiN, Mn, Zr, TiN, TSN, TaN, Ru, Mo, Al, WN, Cu, W, or the like.

In some embodiments, gate 320, like gate 300, may be formed using one or more lithography techniques. Accordingly, an interfacial layer 332 may form a surface for oxide layer 228. For example, similar to interfacial layer 312, interfacial layer 332 may comprise oxide, oxynitride ($Si\text{-}O_xN_y$), HfSiO, or the like.

Figure 3C:
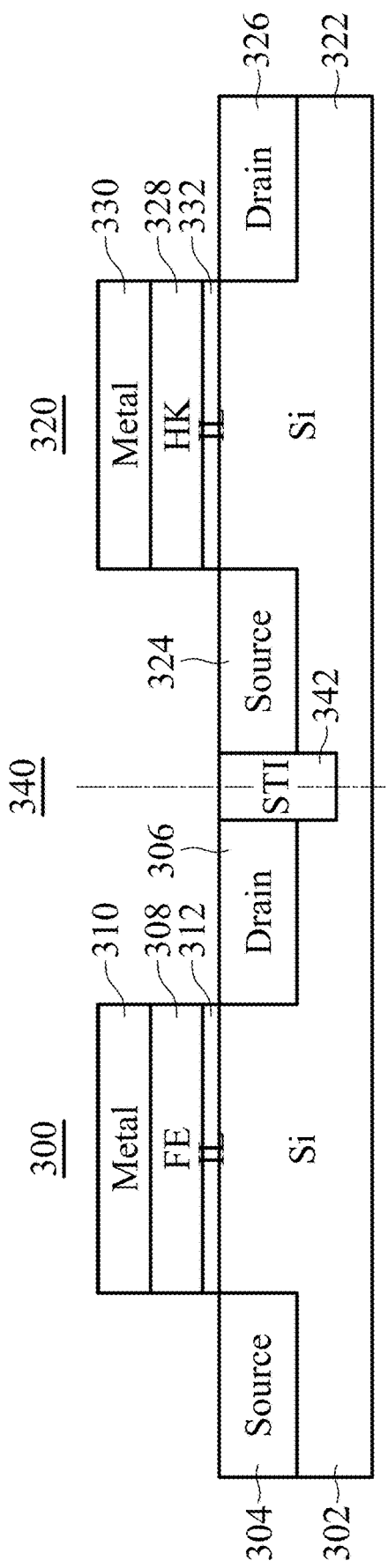
FIG. 3C depicts a hybrid FE-HK gate arrangement, in accordance with some embodiments.

Embodiments of the present disclosure, as shown in FIG. 3C, for example, include configurations such as structure 340 that include different types of gate structures on a single substrate. Some of the gates (e.g., FE gates) included on substrate 302/322 of structure 340 may be especially useful for direct current applications, while other gates (e.g., HK gates) included on substrate 302/322 of structure 340 may be especially useful in alternating current applications. Such a combination of gate types may enable a single device to take advantage of the increased power efficiency offered by FE gates in DC applications due to a reduced subthreshold swing. By relying upon HK gates for AC applications, however, the same device may avoid the shortcomings associated with FE gates in AC applications due to hysteresis in these gates at high frequencies.

In structure 340, FE gate 300 of FIG. 3A and HK gate 320 of FIG. 3B are formed on the same substrate 302/322 and separated using shallow trench isolation 342. Although depicted as a single trench, a plurality of shallow trenches in substrate 302/322 may instead separate FE gate 300 from HK gate 320. Moreover, in some embodiments, deep trench isolation, local oxidation of silicon (LOCOS), or other isolation technologies may be used in addition to or alternatively to shallow trench isolation. By combining gate 300 and gate 320 on a single substrate 302/322, structure 340 may provide a hybrid chip with one gate for DC uses (e.g., gate 300) and one gate for AC uses (e.g., gate 320). Hybrid structure 340 may therefore provide improved power efficiency for DC applications (e.g., by using gate 300) while avoiding hysteresis effects during AC applications (e.g., by using gate 320). Hybrid structure 340 may also include different wiring to activate the FE gates (e.g., FE gate 300) separately from the HK gates (e.g., HK gate 320). In addition to being wired separately, hybrid structure 340 may use trench isolations 342 sized to avoid hysteresis of the FE gates (e.g., FE gate 300) during activation of the HK gates (e.g., HK gate 320).

Figure 4A:
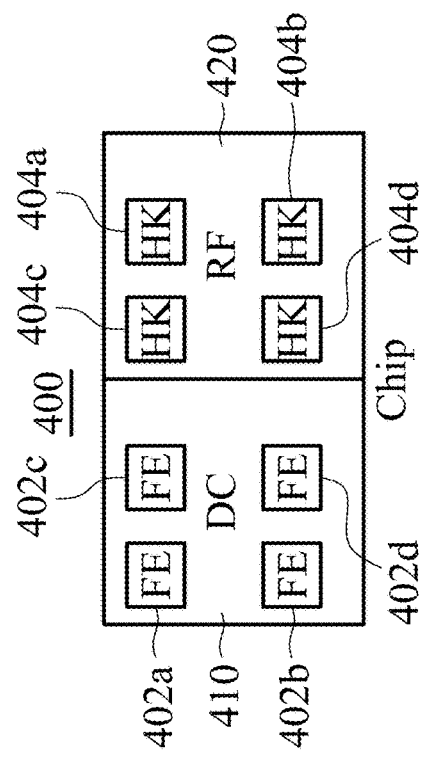
FIG. 4A depicts a semiconductor chip with a direct current (DC) region having FE gates and a radio frequency (RF) region having HK gates, in accordance with some embodiments.

As depicted in FIG. 4A, a plurality of FE gates (e.g., gates 402a, 402b, 402c, and 402d) and HK gates (e.g., gates 404a, 404b, 404c, and 404d) may be combined on a single substrate (thus forming a single 'chip') 400 using the hybrid substructure 340 of FIG. 3C. Accordingly, based on spatial arrangement of the FE gates 402a, 402b, 402c, 402d and HK gates 404a, 404b, 404c, 404d, a portion 410 of chip 400 may be activated for direct current (DC) uses while another portion 420 of chip 400 may be activated for alternating current (AC) uses (also termed radio frequency (RF) uses). In the example of FIG. 4A, portions 410 and 420 are approximately the same size (e.g., the same number of logic gates and/or approximately the same amount of area on chip 400). In other embodiments, however, chip 400 may be customized to particular proportions suitable to different uses, e.g., a 2:1 ratio of portion 410 to portion 420, a 3:1 ratio of portion 410 to portion 420, a 1:2 ratio of portion 410 to portion 420, a 1:3 ratio of portion 410 to portion 420, or the like. Additionally or alternatively, any number of FE gates and HK gates may be used, even though the example of FIG. 4A depicts four FE gates and four HK gates.

Figure 4C:
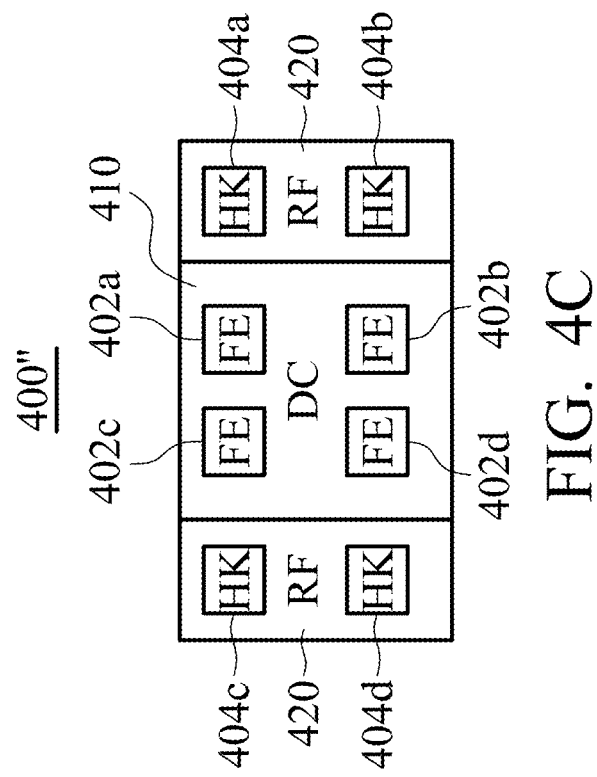
FIG. 4C depicts another semiconductor chip with a DC region having FE gates and an RF region having HK gates, in accordance with some embodiments.
Figure 4B:
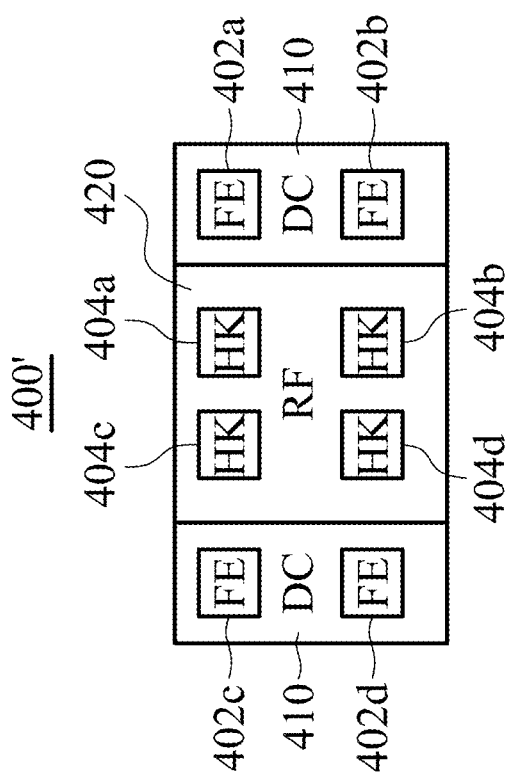
FIG. 4B depicts another semiconductor chip with a DC region having FE gates and an RF region having HK gates, in accordance with some embodiments.

Moreover, although depicted as spatially contiguous, portions 410 and 420 may comprise discontinuous portions of chip 400. For example, as depicted in chip 400' FIG. 4B, portion 410 may comprise two regions of chip 400 separated by portion 420. In another example depicted in chip 400" FIG. 4C, portion 420 may comprise two regions of chip 400 separated by portion 410. Accordingly, the portions may be arranged suitable to different uses.

Figure 5:
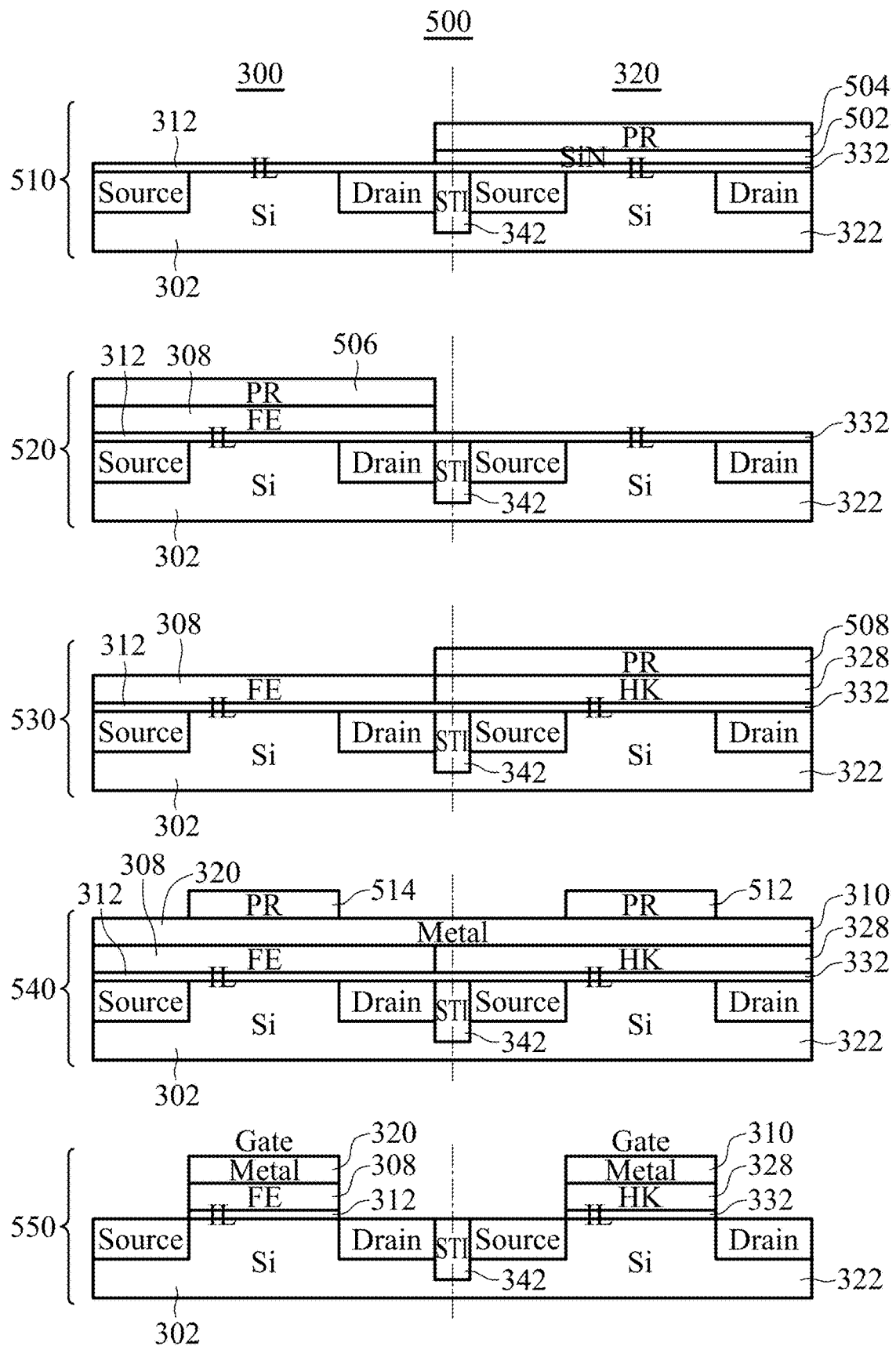
FIG. 5 depicts a process of forming a hybrid FE-HK gate, in accordance with some embodiments.

FIG. 5 depicts a process 500 for forming FE gate 300 and HK gate 320 on a single substrate 302/322. As depicted in FIG. 5, process 500 may begin with a substrate 302/322 already including trenches (e.g., trench 342). In some embodiments, the trenches may separate substrate 302/322 into portions intended for gates, such as FE gate 300 and HK gate 320. Any suitable lithography technique may be used to form the trenches. For example, as explained above, the trenches may be formed using shallow trench isolation, deep trench isolation, local oxidation of silicon (LOCOS), or other isolation technologies.

In some embodiments, as depicted in FIG. 5, substrate 302/322 for process 500 may already include source regions and drain regions. Any suitable technique may be used to form the source/drain regions. For example, p-type impurities (such as boron or the like) may be implanted in substrate 302/322 (e.g., using an ion beam, annealing, or a combination thereof) to form n-type sources and/or drains. Additionally, or alternatively, n-type impurities (such as arsenic, phosphorus, or the like) may be implanted in substrate 302/322 (e.g., using an ion beam, annealing, or a combination thereof) to form n-type sources and/or drains.

Process 500 may begin with a substrate 302/322 already including an interfacial layer 312/332, as depicted in the example of FIG. 5. For example, interfacial layer 312/332 may have been formed using spin coating, vapor deposition, e-beam deposition, or any other formation technique. As explained above, interfacial layer 312/332 may comprise oxide, oxynitride ($SiO_xN_y$), HfSiO, or the like.

In some embodiments, prior to step 510, substrate 320/322 may be provided having source and drain regions as well as interfacial layer 312/332 formed thereon. At step 510, a protective layer (PR) 504 may be formed over portions of substrate 302/332 on which HK gates (e.g., HK gate 320) will be formed. Similar to interfacial layer 312/332, protective layer 504 may be formed using spin coating, vapor deposition, e-beam deposition, or any other formation technique. Protective layer 504 may comprise one or more photoresist materials. For example, protective layer 504 may include positive and/or negative photoresist.

In some embodiments, as depicted in FIG. 5, step 510 may include forming a sacrificial layer 502 before forming protective layer 504. Sacrificial layer 502 may be formed to protect interfacial layer 312/332 during subsequent fabrication steps. For example, sacrificial layer 502 may be used to protect interfacial layer 312/332 over HK gate regions 320 during subsequent etching steps. In such embodiments, protective layer 504 may be formed over sacrificial layer 502. For example, sacrificial layer 502 may be formed over substrate 320/322 using spin coating, vapor deposition, e-beam deposition, or any other formation technique prior to forming protective layer 504 and after forming interfacial layer 312/332. In some embodiments, sacrificial layer 502 may be formed with dielectric materials such as silicon dioxide, silicon nitride, or the like. Alternatively, or additionally, sacrificial layer 502 may be formed with materials based on etch rate differentials. For example, sacrificial layer 502 may be formed with materials that have a low etch rate when compared with ferroelectric films.

At step 520, ferroelectric film 308 may be formed over portions of substrate 302/332 on which FE gates (e.g., FE gate 300) will be formed. For example, ferroelectric film 308 may be formed over portions of substrate 302/332 not covered by protective layer 504 (and/or sacrificial layer 502). Ferroelectric film 308 may be formed using spin coating, vapor deposition, e-beam deposition, or any other formation technique.

In some embodiments, ferroelectric film 308 may be selectively deposited on regions corresponding to FE gate 300 using, for example, shadow mask lithography and/or direct lithography techniques. Alternatively, or additionally, ferroelectric film 308 may be formed using subtractive microfabrication techniques. For example, ferroelectric film 308 may be formed over all, or majority of, substrate 302/332 and then etched from portions not corresponding to FE gate 300 regions. In such embodiments, protective layer 506 may be patterned on ferroelectric film 308 during step 520. Accordingly, protective layer 506 may protect ferroelectric film 308 on FE gate 300 regions during etching ferroelectric film 308 etching steps.

Also at step 520, as depicted in FIG. 5, protective layer 504 (from step 510) may be etched before or after patterning ferroelectric film 308—thus protective layer 504 is not shown in step 520. For example, before patterning ferroelectric film 308, substrate 302/332 may be exposed to an organic solvent to remove protective layer 504. Moreover, in embodiments that include forming sacrificial layer 502, sacrificial layer 502 may also be etched in step 520—thus sacrificial layer 502 is not shown in step 520 in FIG. 5. For example, substrate 302/332 may be exposed to a etchant that selectively removes silicon nitride, such as hydrogen fluoride, $CF_4$, and/or $NF_3$.

In some embodiments, any stray ferroelectric material that is not over FE gate 300 may be removed in step 520. For example, ferroelectric film 308 formed over HK gates regions (e.g., HK gate 320), may be also etched in step 520. For example, substrate 302/332 may be exposed to etchants to ferroelectric film 308, such as $Cl_2$/Ar, in step 520. In such embodiments, any ferroelectric film 308 that is exposed (i.e., not protected by protective layer 506) may be removed. Removing ferroelectric film 308 from HK gate 320 regions may prevent malfunctions on the HK gates and improve HK gate 320 performance.

Although not depicted in FIG. 5, a further sacrificial layer may be formed between ferroelectric film 308 and protective layer 506. The further sacrificial layer may be formed using spin coating, vapor deposition, e-beam deposition, or any other formation technique, prior to forming protective layer 506 and after forming ferroelectric film 308.

At step 530, dielectric film 328 may be formed over portions of substrate 302/332 on which HK gates (e.g., HK gate 320) will be formed. For example, dielectric film 328 may be formed over portions of substrate 302/332 not covered by ferroelectric film 308 and/or protective layer 506. Dielectric film 328 may be formed using spin coating, vapor deposition, e-beam deposition, or any other formation technique.

In some embodiments, dielectric film 328 may be selectively formed on regions corresponding to HK gate 320 using, for example, shadow mask lithography and/or direct lithography techniques. Alternatively, or additionally, dielectric film 328 may be formed using subtractive microfabrication techniques. For example, dielectric film 328 may be formed over all, or majority of, substrate 302/332 and then etched from portions not corresponding to HK gate 320 (and other HK gates). In such embodiments, a protective layer 508 may be patterned on dielectric film 328 during step 530. Accordingly, protective layer 508 may protect dielectric film 328 on HK gate 320 regions during etching of the dielectric film 328 etching steps.

Also at step 530, as depicted in FIG. 5, protective layer 506 may be etched before or after forming dielectric film 328—thus protective layer 506 is not shown in step 530 in FIG. 5. In embodiments including another sacrificial layer (not shown), the sacrificial layer may also be etched with protective layer 506.

In some embodiments, any stray dielectric film 328 that is not over HK gate 320 may be removed in step 530. For example, dielectric film 328 formed over the portions of substrate 302/332 on which FE gates (e.g., FE gate 300) will be formed, may be also etched in step 520. For example, substrate 302/332 may be exposed to etchants to dielectric film 328, such as CF$_4$, in step 520. In such embodiments, any dielectric film 328 that is exposed (i.e., not protected by protective layer 508) may be removed. Removing ferroelectric film 308 from FE gate 300 regions may prevent malfunctions on the FE gates and improve FE gate 300 performance.

At step 540, projective layer 508 may be etched and metal 310 may be formed over both FE gate regions (e.g., FE gate 300) and HK gate regions (e.g., HK gate 320). For example, metal 310 may be formed over substrate 302/332 using e-beam deposition, CVD (chemical vapor deposition), and/or PVD (physical vapor deposition). Alternatively, or additionally, metal 310 may be formed using spin coating, e-beam deposition, or any other formation technique. In some embodiments, as depicted in FIG. 5, metal 310 may be formed over all (or a majority) of substrate 302/332.

As further depicted in FIG. 5, protective layers 512 and 514 may be formed over FE gates regions (e.g., FE gate 300) and HK gates regions (e.g., HK gate 320) respectively. For example, protective layers 512 and 514 may be selectively formed using a photomask or direct lithography techniques. Additionally or alternatively, protective layers 512 and 514 may be formed using spin coating, vapor deposition, e-beam deposition, or any other formation technique. Protective layers 512 and 514 may allow for etching all excess ferroelectric film 308, dielectric film 328, and metal 310 in step 550 without etching ferroelectric material and metal forming FE gates (e.g., FE gate 300) and without etching dielectric material and metal forming HK gates (e.g., HK gate 320), as explained below with respect to step 550.

At step 550, excess ferroelectric film 308, dielectric film 328, metal 310, and interfacial layer 312/332, that is not over FE gate regions (e.g., FE gate 300) or HK gate regions (e.g., HK gate 320) may be etched. For example, in some embodiments, any drain an source regions may be exposed in step 550. Accordingly, excess ferroelectric film 308, dielectric film 328, and metal 310 not under protective layers 512 and 514 may be etched. In addition, protective layers 512 and 514 may also be etched, whether in the same or a different etching step. In some embodiments, portions of interfacial layer 312/332 over the same portions of substrate 302/322 as the excess ferroelectric material, dielectric material, and metal may be etched along with the excess ferroelectric material, dielectric material, and metal.

As explained, in any of the steps described above, sacrificial layers and protective layers may be selectively formed using a photomask, formed across substrate 302/332 and then selectively removed using lithography, selective ultraviolet (UV) light, and/or other radiation exposure. Alternatively, or additionally, sacrificial layers may be directly deposited. Moreover, any etching in any of the steps described above may be performed using one or more wet etching techniques (e.g., using a wet etchant selected to remove only the desired layer), and/or one or more dry etching techniques (e.g., using a plasma to remove layers not protected by a protective layer).

In some embodiments, process 500 may form FE gates (e.g., FE gate 300) followed by HK gates (e.g., HK gate 320). However, in other embodiments, HK gates may be formed prior to FE gates. For example, at step 510, protective layer 504 may be formed over FE gate 300 regions. Then, dielectric layer 328 may be formed with protective layer 508. Accordingly, protective layer 508 may be etched before or after deposition of ferroelectric layer 308 and protective layer 506, and metal layer 310 may then be formed after etching of protective layer 506 rather than protective layer 508. The remainder of process 500 may then proceed as explained above.

Although not depicted in FIG. 5, one or more channels may also be formed on substrate 302/322 overlapping regions of FE gate 300 and/or HK gate 320. The channels may comprise Si, SiGe, Ge, or the like. Additionally or alternatively, the channels may comprise two-dimensional materials such as graphene, MoS$_2$, WSe$_2$, HfTe$_2$, or the like. The channels may be formed on the substrate using direct printing techniques or as part of the lithography process described above. Alternatively, the channels may comprise doped portions of substrate 302/322 rather than including additional material formed thereon.

The channels may connect FE gate 300 to other FE gates on the same substrate and HK gate 320 to other HK gates on the same substrate. As explained above with respect to FIG. 4, FE gates and HK gates generally will not be connected to avoid hysteresis during AC current uses of the chip.

Figure 6:
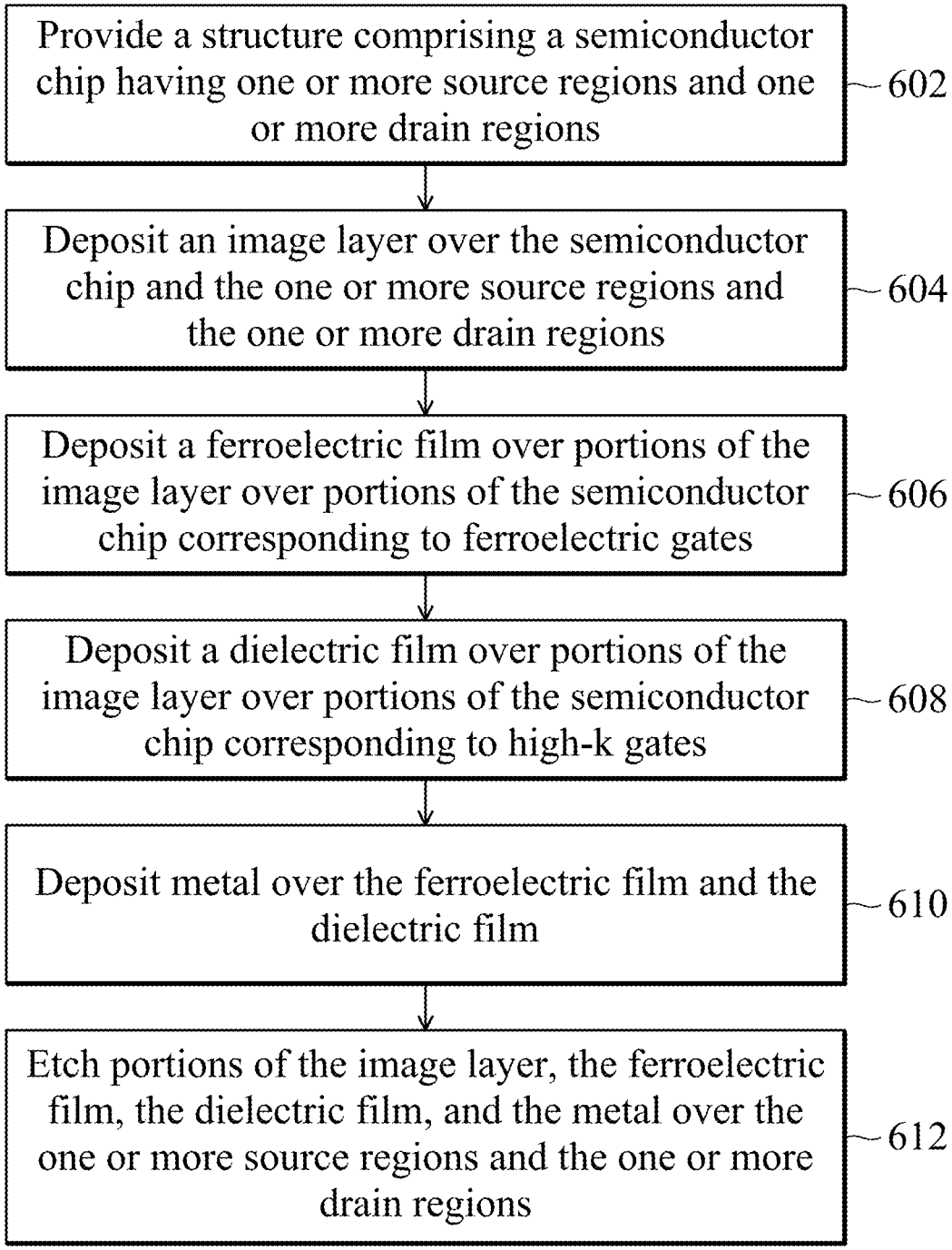
FIG. 6 is a flowchart of a process for forming a hybrid FE-HK gate, in accordance with some embodiments.

FIG. 6 depicts a method 600 of forming a hybrid chip (e.g., chip 400) with both FE gates (e.g., FE gate 300) and HK gates (e.g., HK gate 320). Although described with reference to portions of FIG. 5, method 600 is not limited to the embodiment depicted in FIG. 5.

As depicted in FIG. 6, method 600 may include providing a structure including a semiconductor chip (e.g., substrate 302/322) having one or more source regions (e.g., sources 304 and 324) and one or more drain regions (e.g., drains 306 and 326) (step 602). For example, the semiconductor chip 302/322 may comprise silicon or other semiconductor materials. In some embodiments, the semiconductor chip 302/322 may comprise a plurality of conductors in a composite.

In some embodiments, method 600 may further include forming the one or more source regions 304, 324 and the one or more drain regions 306, 326 by diffusing at least one of n-wells or p-wells in the semiconductor chip 302/322. For example, doping of the semiconductor chip 302/322 in particular areas may diffuse the n-wells and/or p-wells. These wells may thus form the one or more source regions 304, 324 and the one or more drain regions 306, 326. In embodiments where the semiconductor chip 302/322 comprises a FinFET architecture, the one or more source regions 304, 324 and the one or more drain regions 306, 326 may be deposited or formed rather than diffused.

Additionally or alternatively, method 600 may include forming isolation trenches (e.g., trench(es) 342) between first portions and second portions of the semiconductor chip 302/322. For example, as one or more ordinary skill will recognize, lithography techniques may be used to form shallow trenches and/or deep trenches between portions of the semiconductor chip intended for ferroelectric (FE) gates and portions intended for high-κ (HK) gates.

As further depicted in FIG. 6, method 600 may include depositing or forming an interfacial layer (e.g., interfacial layer 312/332) over the semiconductor chip 302/322 and the one or more source regions 304, 324 and the one or more drain regions 306, 326 (step 604). For example, as explained above, interfacial layer 312/332 may comprise oxide, oxynitride, HfSiO, or the like.

As depicted in FIG. 6, method 600 may include depositing or forming a ferroelectric film (e.g., film 308) over portions of the interfacial layer 312/332 corresponding to first portions of the semiconductor chip 302/322 (step 606). For example, as explained above, ferroelectric film 308 may comprise a perovskite (e.g., Pb(Zr, Ti)O$_3$, SrBi$_2$Ta$_2$O$_9$, BaTiO$_3$, (Bi, La)4Ti$_3$O$_{12}$, or the like), an HfO$_2$-based material (e.g., HfZrO, HfGeO, HfLaO, HfSiO, HfGdO, HfYO, HfScO, HfNbO, HfAlO, or the like), an organic polymer (e.g., PolyVinylidene Fluoride, TrFE (Trifluoroethylene), or the like), or any other ferroelectric material.

As depicted in FIG. 6, method 600 may include depositing or forming a dielectric film (e.g., film 328) over portions of the interfacial layer 312/332 corresponding to second portions of the semiconductor chip 302/322 (step 608). For example, as explained above, dielectric film 328 may comprise $HfO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba, Sr)TiO_3$ (BST), $Al_2O_3$, $Si_3N_4$, silicon oxynitrides ($SiO_xN_y$), or the like.

As further depicted in FIG. 6, method 600 may include depositing or forming metal (e.g., metal 310) over the ferroelectric film 308 and the dielectric film 328 (step 610). For example, as explained above, metal 310 may comprise Ti, Ag, Al, TiAlN, TaC, TaCN, TaSiN, Mn, Zr, TiN, TSN, TaN, Ru, Mo, Al, WN, Cu, W, or the like.

As depicted in FIG. 6, method 600 may include etching portions of the interfacial layer 312/332, the ferroelectric film 308, the dielectric film 328, and the metal 310 over the one or more source regions 304, 324 and the one or more drain regions 306, 326 (step 612). In some embodiments, as explained above, the interfacial layer 312/332, the ferroelectric film 308, the dielectric film 328, and the metal 310 may be etched over all portions of substrate 302/322 not over FE gates (e.g., gate 300) and HK gates (e.g., gate 320).

Method 600 may further include additional steps. For example, method 600 may further include depositing or forming a sacrificial layer 502 over the interfacial layer 312/332 before forming the ferroelectric film 308 or forming the dielectric film 328.

In such embodiments, method 600 may further include depositing or forming a protective layer 504 on the sacrificial layer 502 over the second portions of the semiconductor chip and etching the sacrificial layer 502 from the first portions of the semiconductor chip before forming the ferroelectric film 328. Additionally or alternatively, in such embodiments, method 600 may further include depositing or forming a protective layer on the sacrificial layer over the first portions of the semiconductor chip and etching the sacrificial layer from the second portions of the semiconductor chip before forming the dielectric film 328.

In any of the embodiments described above, method 600 may further include depositing or forming a protective layer 508 on the dielectric film 328, etching the dielectric film 328 from the first portions of the semiconductor chip, and etching the protective layer 508 before forming the metal 310. Additionally or alternatively, method 600 may further include depositing or forming a protective layer 506 on the ferroelectric film 308, etching the ferroelectric film 308 from the second portions of the semiconductor chip, and etching the protective layer 506 before forming the metal 310.

In any of the embodiments described above, method 600 may further include depositing or forming a protective layer 512, 514 over the metal 310 over portions of the semiconductor chip not including the one or more source regions and the one or more drain regions, and etching the protective layer 512, 514 after etching portions of the interfacial layer, the ferroelectric film, the dielectric film, and the metal.

Embodiments of the present disclosure may provide a ferroelectric (FE) gate and a high-κ (HK) gate on a single semiconductor substrate. For example, a semiconductor chip with both ferroelectric (FE) gates and high-κ (HK) gates may form a CMOS architecture, a FinFET architecture, or any other transistor architecture. By using a hybrid structure including both ferroelectric (FE) gates and high-κ (HK) gates, embodiments of the present disclosure may provide improved power efficiency during direct current (DC) applications without malfunction during alternating current (AC) applications.

In one embodiment, an integrated circuit may comprise a first region with at least one ferroelectric gate, at least one source associated with the at least one ferroelectric gate of the first region, and at least one associated drain associated with the at least one ferroelectric gate of the first region, as well as a second region with at least one high-κ gate, at least one source associated with the at least one high-κ gate of the second region, and at least one associated drain associated with the at least one high-κ gate of the second region. The integrated circuit may also comprise at least one trench isolation between the first region and the second region.

In one embodiment, a method of fabricating an integrated circuit may include providing a structure having a semiconductor chip having one or more source regions and one or more drain regions and forming an interfacial layer over the semiconductor chip and the one or more source regions and the one or more drain regions. The method may further comprise forming a ferroelectric film over portions of the interfacial layer corresponding to first portions of the semiconductor chip and forming a dielectric film over portions of the interfacial layer corresponding to second portions of the semiconductor chip. The method may further comprise forming metal over the ferroelectric film and the dielectric film and etching portions of the interfacial layer, the ferroelectric film, the dielectric film, and the metal over the one or more source regions and the one or more drain regions. Accordingly, the first portions may include ferroelectric gates, and the second portions may include high-κ gates.

In one embodiment, a complementary metal-oxide-semiconductor may comprise a semiconductor chip having a first region and a second region. The semiconductor chip may also have one or more isolation regions between the first region and the second region. Consistent with the present disclosure, the first region may comprise one or more ferroelectric gates, and the second region may comprise one or more high-κ gates. Accordingly, the first region may be configured for activation using direct current, and the second region may be configured for activation using alternating current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first region comprising at least one first gate structure having a ferroelectric gate dielectric and being associated with a first source and a first drain;
a second region adjacent to the first region, the second region comprising at least one second gate structure having a high-κ gate dielectric, and being associated with a second source and a second drain; and
a first trench isolation in contact with a drain of the first region and a source of the second region, wherein a width of the first trench isolation is selected to avoid hysteresis of the at least one first gate structure during activation of the at least one second gate structure.

2. The integrated circuit of claim 1, wherein the ferroelectric gate dielectric has a thickness between about 0.5 nm and about 20 nm.

3. The integrated circuit of claim 1, wherein a ratio between an area of the first region having the at least one first gate structure to an area of the second region having the at least one second gate structure is 3:1.

4. The integrated circuit of claim 1, further comprising:
a third region adjacent to the first region, the second region and the third region being on opposite sides of the first region, the third region comprising at least one third gate structure having the high-κ gate dielectric; and
a second trench isolation between the first region and the third region, the second trench isolation being in contact with a source of the first region and a drain of the third region.

5. The integrated circuit of claim 1, wherein the first gate structure comprises an interfacial layer, a ferroelectric film, and a metal layer.

6. The integrated circuit of claim 5, wherein the metal layer comprises at least one of Ti, Ag, Al, TiAlN, TaC, TaCN, TaSiN, Mn, Zr, TiN, TSN, TaN, Ru, Mo, Al, WN, Cu, or W.

7. The integrated circuit of claim 5, wherein the ferroelectric film comprises one of perovskites, HfO2-based compounds, or organic polymers.

8. The integrated circuit of claim 7, wherein the ferroelectric film comprises at least one of Pb(Zr, Ti)O3, SrBi2Ta2O9, BaTiO3, (Bi, La)4Ti3O12, HfZrO, HfGeO, HfLaO, HfNO, HfSiO, HfGdO, HfYO, HfScO, HfNbO, HfAlO, PolyVinylidene Fluoride, or TrFE (Trifluoroethylene).

9. The integrated circuit of claim 1, wherein the second gate structure comprises an interfacial layer, a dielectric film, and a metal layer.

10. The integrated circuit of claim 9, wherein the dielectric film comprises at least one of HfO2, LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba, Sr)TiO3 (BST), Al2O3, Si3N4, or a silicon oxynitride (SiOxNy).

11. The integrated circuit of claim 9, wherein the metal layer comprises at least one of Ti, Ag, Al, TiAlN, TaC, TaCN, TaSiN, Mn, Zr, TiN, TSN, TaN, Ru, Mo, Al, WN, Cu, or W.

12. A method of fabricating an integrated circuit, comprising:
forming one or more source regions and one or more drain regions on a substrate;
forming an interfacial layer over the one or more source regions and the one or more drain regions;
forming a ferroelectric film and a dielectric film over respective portions of the interfacial layer;
forming metal over the ferroelectric film and the dielectric film; and
etching portions of the interfacial layer, the ferroelectric film, the dielectric film, and the metal over the one or more source regions and the one or more drain regions, to form an integrated circuit comprising a first region, a second region adjacent to the first region, and a first trench isolation contacting a drain of the first region and a source of the second region.

13. The method of claim 12, further comprising:
forming a sacrificial layer over the interfacial layer before forming the ferroelectric film or forming the dielectric film.

14. The method of claim 13, further comprising:
forming a protective layer on the sacrificial layer over portions corresponding to the ferroelectric film; and
etching the sacrificial layer before forming the dielectric film.

15. The method of claim 13, further comprising:
forming a protective layer on the sacrificial layer over portions corresponding to the dielectric film; and
etching the sacrificial layer before forming the ferroelectric film.

16. The method of claim 12, further comprising:
forming a protective layer on the dielectric film;
etching the dielectric film; and
etching the protective layer before forming the metal.

17. The method of claim 12, further comprising:
forming a protective layer on the ferroelectric film;
etching the ferroelectric film; and
etching the protective layer before forming the metal.

18. The method of claim 12, further comprising:
forming a protective layer over the metal; and
etching the protective layer after etching portions of the interfacial layer, the ferroelectric film, the dielectric film, and the metal.

19. The method of claim 12, further comprising:
forming isolation trenches between the portions corresponding to the ferroelectric film and the portions corresponding to the dielectric film.

20. A semiconductor device, comprising:
a first region comprising one or more first gate structures having a ferroelectric gate dielectric material and is configured for activation using direct current;
a second region comprising one or more second gate structures having a high-κ gate dielectric material and is configured for activation using alternating current; and
one or more isolation regions comprising at least one trench isolation contacting a drain of the first region and a source of the second region, wherein a width of the at least one trench isolation is selected to avoid hysteresis of the one or more first gate structures during activation of the one or more second gate structures;
wherein the first region and the second region are wired for separate activations and the one or more first gate structures and the one or more second gate structures are coplanar on one or more planes perpendicular to a direction of the at least one trench isolation.

* * * * *